(12) United States Patent
Chan et al.

(10) Patent No.: US 8,907,371 B2
(45) Date of Patent: Dec. 9, 2014

(54) LIGHT EMITTING DIODE PACKAGE AND LIGHT EMITTING DEVICE HAVING THE SAME

(75) Inventors: Shiun-Wei Chan, Hsinchu (TW); Chih-Hsun Ke, Hsinchu (TW); Chao-Hsiung Chang, Hsinchu County (TW)

(73) Assignee: Advanced Optoelectronic Technology, Inc., Hsinchu Hsien (TW)

( * ) Notice: Subject to any disclaimer, the term of this patent is extended or adjusted under 35 U.S.C. 154(b) by 457 days.

(21) Appl. No.: 13/283,605

(22) Filed: Oct. 28, 2011

(65) Prior Publication Data
US 2012/0217525 A1 Aug. 30, 2012

(30) Foreign Application Priority Data

Feb. 25, 2011 (CN) .......................... 2011 1 0048194

(51) Int. Cl.
| | |
|---|---|
| H01L 33/54 | (2010.01) |
| H01L 33/64 | (2010.01) |
| H05K 1/02 | (2006.01) |
| H01L 33/48 | (2010.01) |

(52) U.S. Cl.
CPC ............ *H01L 33/486* (2013.01); *H05K 1/0204* (2013.01); *H05K 2201/10416* (2013.01); *H05K 2201/10106* (2013.01); *H01L 2924/1815* (2013.01); *H01L 33/54* (2013.01); *H01L 2224/48091* (2013.01)
USPC ................................. 257/100; 257/99; 257/98

(58) Field of Classification Search
USPC ..................... 257/79–100, E33.055–E33.075
See application file for complete search history.

(56) References Cited

U.S. PATENT DOCUMENTS

| 2009/0045432 | A1 | 2/2009 | Kim et al. | |
|---|---|---|---|---|
| 2011/0121339 | A1* | 5/2011 | Wu | ................................. 257/98 |
| 2011/0175512 | A1* | 7/2011 | Lai | ................................. 313/46 |
| 2011/0266571 | A1* | 11/2011 | Zeiler et al. | ..................... 257/98 |

FOREIGN PATENT DOCUMENTS

| CN | 1874010 A | 12/2006 |
|---|---|---|
| CN | 101533886 A | 9/2009 |
| TW | 200950132 | 12/2009 |
| TW | M376119 U1 | 3/2010 |

\* cited by examiner

*Primary Examiner* — Matthew W Such
*Assistant Examiner* — Scott Stowe
(74) *Attorney, Agent, or Firm* — Novak Druce Connolly Bove + Quigg LLP (57) ABSTRACT

An LED package includes a light transmissive encapsulation, an LED die embedded in the encapsulation from a bottom surface of the encapsulation, a positive electrode electrically connected to an anode of the LED die, and a negative electrode electrically connected to a cathode of the LED die. The encapsulation includes a light emitting surface opposite to the bottom surface thereof. The LED die includes a front surface for outputting light outward, and a back surface opposite to the front surface. The front surface is covered by the encapsulation and faces the light emitting surface of the encapsulation. The back surface is exposed outside. A light emitting device is provided by mounting the LED package to a circuit board. The circuit board has a heat conductor connecting with the LED die.

20 Claims, 13 Drawing Sheets

LIGHT EMITTING DIODE PACKAGE AND LIGHT EMITTING DEVICE HAVING THE SAME

BACKGROUND

1. Technical Field

The present disclosure generally relates to light emitting diode (LED) packages and light emitting device having the same.

2. Description of Related Art

With the continuing development of scientific technology and the rise of people's consciousness of energy saving, LEDs have been widely used in the field of illumination due to their small size and high efficiency. However the LEDs generate a great deal of heat when they are driven by electrical power to emit light. The heat results in a rise of temperature of the LEDs. If the temperature exceeds a predetermined value, a performance of the LED will deteriorate. Therefore, how to effective cool down the LEDs during operation thereof to increase light emitting efficiency, improve luminance, and extend longer service life has become an issue pending urgent solution in the trade.

Therefore, it is necessary to provide an LED package overcoming above shortcomings.

BRIEF DESCRIPTION OF THE DRAWINGS

Many aspects of the disclosure can be better understood with reference to the following drawings. The components in the drawings are not necessarily drawn to scale, the emphasis instead being placed upon clearly illustrating the principles of the disclosure.

DETAILED DESCRIPTION

Reference will now be made to the drawings to describe the present LED packages and light emitting devices in detail.

Figure 1:
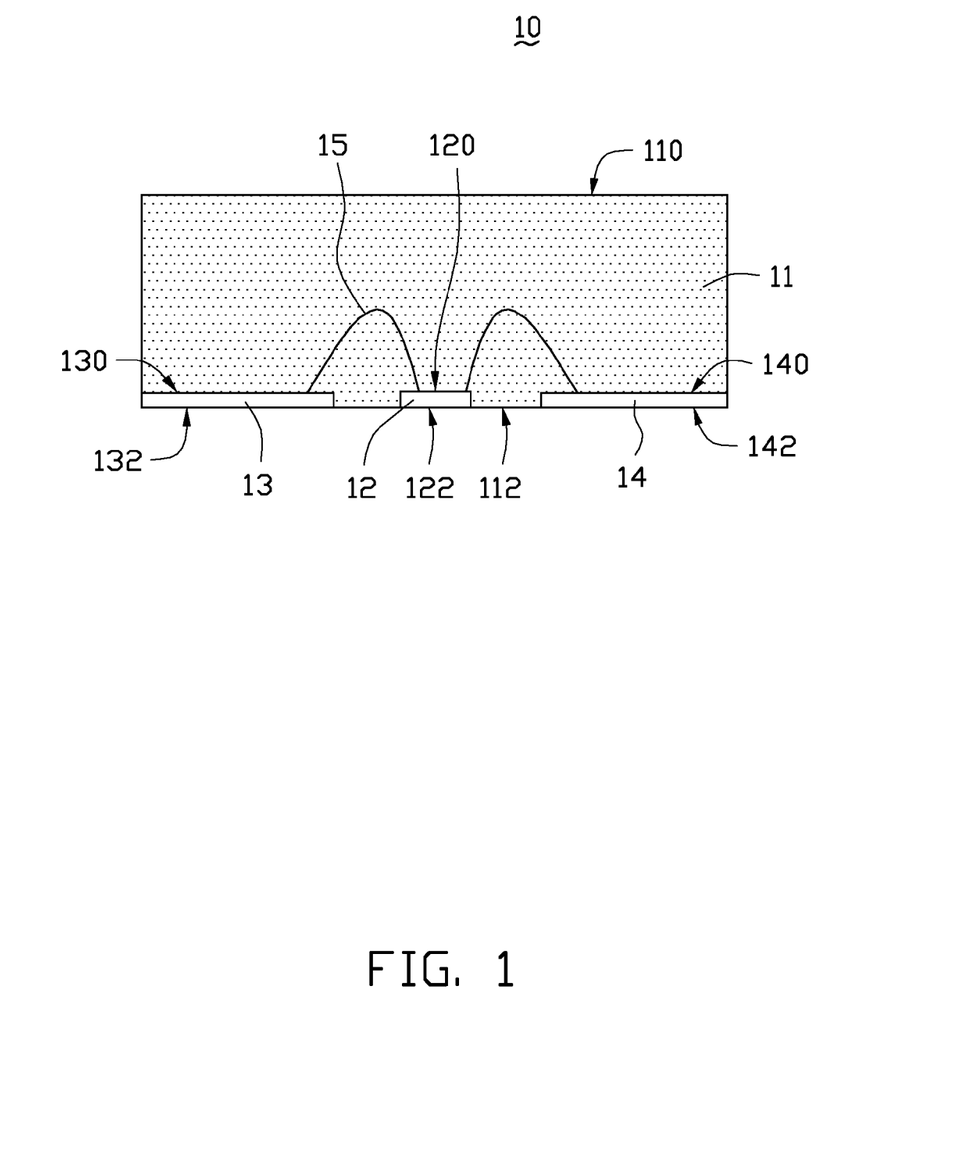
FIG. 1 is a schematic, cross-sectional view of an LED package in accordance with a first embodiment of the present disclosure.

Referring to FIG. 1, an LED package 10 according to a first embodiment includes an encapsulation 11, an LED die 12, a positive electrode 13, and a negative electrode 14.

The encapsulation 11 is made of light transmissive materials, such as polycarbonate, polymethyl methacrylate (PMMA) and so on. The encapsulation 11 includes a light emitting surface 110, and a bottom surface 112 opposite to the light emitting surface 110.

The LED die 12 includes a front surface 120, and a back surface 122 opposite to the front surface 120. The front surface 120 is for outputting light outward. The back surface 122 is for dissipating heat outward. The LED die 12 is totally embedded in the encapsulation 11 with the front surface 120 facing the light emitting surface 110 while covered by the encapsulation 11, and the back surface 122 being coplanar with the bottom surface 112 and exposed to an external environment. In this embodiment, the back surface 122 and the bottom surface 112 are both planar surfaces.

The positive and negative electrodes 13 and 14 are respectively connected to an anode and a cathode (not illustrated) of the LED die 12 by metal wires 15. The positive and negative electrodes 13 and 14 are both planar sheets. The positive electrode 13 includes an attaching surface 130 facing the light emitting surface 110 and embedded in the encapsulation 11, and a mounting surface 132 opposite to the attaching surface 130. The negative electrode 14 includes an attaching surface 140 facing the light emitting surface 110 and embedded in the encapsulation 11, and a mounting surface 142 opposite to the attaching surface 140. In this embodiment, the positive and negative electrodes 13 and 14 are totally embedded in the encapsulation 11, and the mounting surfaces 132, 142 and the bottom surface 112 are coplanar, whereby the mounting surface 132, 142 are exposed to the external environment.

Figure 2:
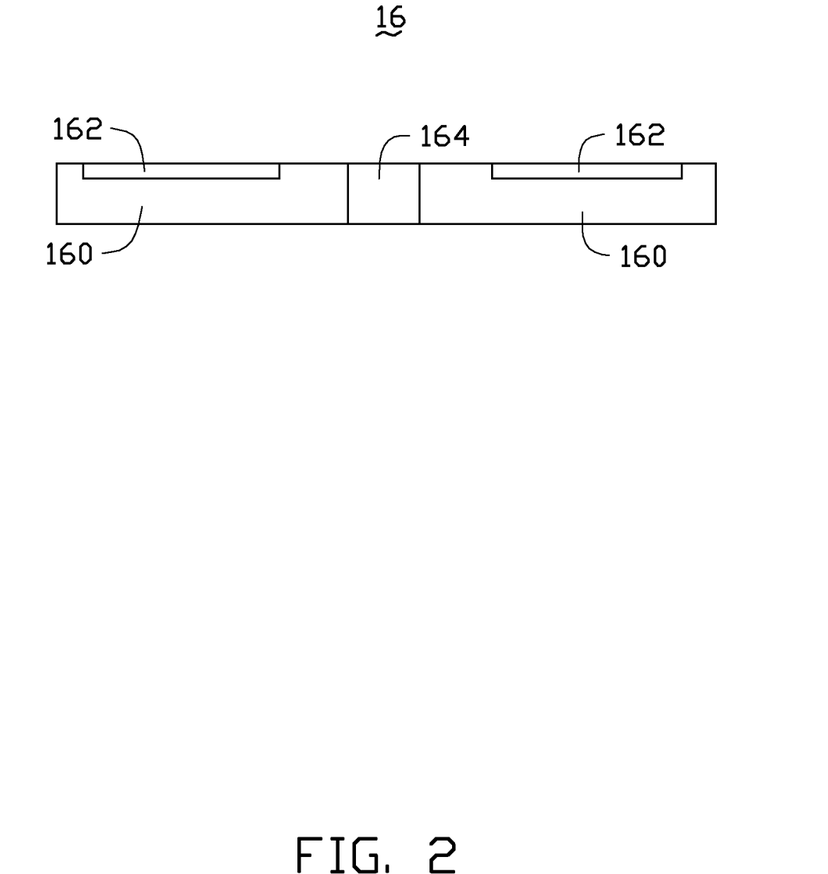
FIG. 2 is a schematic, cross-sectional view of a circuit board matching the LED package of FIG. 1.

Referring to FIG. 2, a circuit board 16 matching the LED package 10 is provided. The circuit board 16 includes a substrate 160, circuit traces 162 arranged on the substrate 160, and a heat conductor 164 extending in the substrate 160. Top and bottom faces of the heat conductor 14 are exposed to the external environment. The substrate 160 is made of an electrically insulating material. The circuit traces 162 are for contacting the positive and negative electrodes 13 and 14, thereby providing electrical power to the LED die 12. The heat conductor 164 is made of a material with a high thermal conductivity, for example metal.

Figure 3:
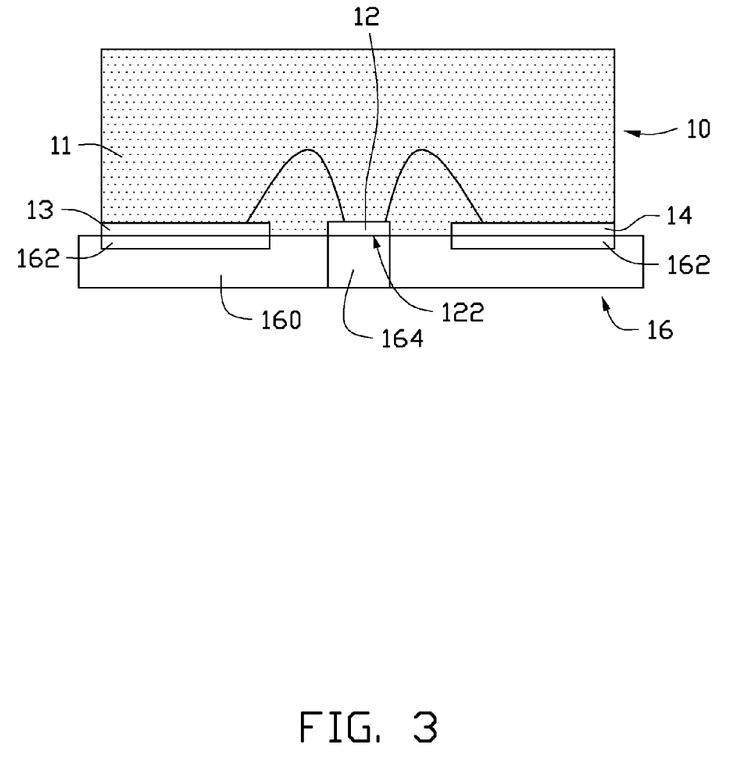
FIG. 3 is a schematic, cross-sectional view of the LED package of FIG. 1 mounted on the circuit board of FIG. 2 to form a light emitting device in accordance with a first embodiment of the present disclosure.

Referring to FIG. 3, due to that the back surface 122 is exposed, the LED die 12 directly contacts the heat conductor 164 when mounted to the circuit board 16, when the LED package 10 is mounted on the circuit board 16 to form a light emitting device. Accordingly, heat generated by the LED die 12 can be transferred out, via the high heat conductive heat conductor 164 for dissipation. Thereby, high efficiency of heat dissipation is achieved. In addition, the LED package 10 can be further equipped with heat sinks or/and heat pipes in thermal connection with the heat conductor 164, thereby helping heat dissipation from the heat conductor 164 to the external environment.

According to variations of the first embodiment, the back surface 122 of the LED die 12 and the bottom surface 112 of the encapsulation 11 can also be non-coplanar.

Figure 4:
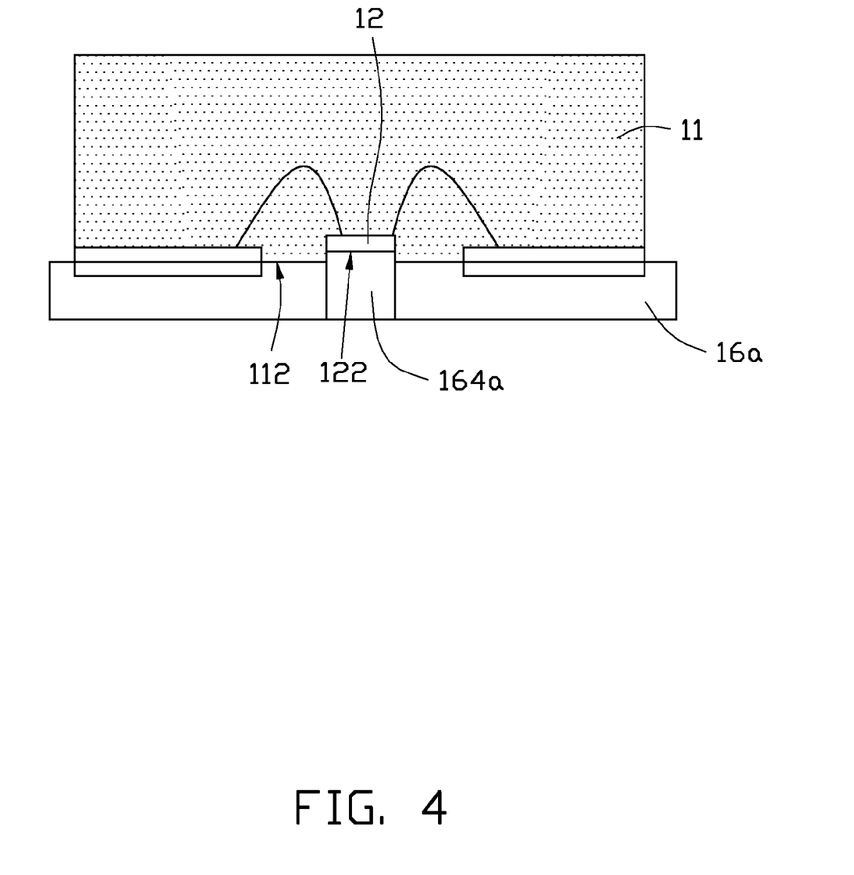
FIG. 4 is a schematic, cross-sectional view of a light emitting device in accordance with a first variation of the first embodiment.

Referring to FIG. 4, the back surface 122 of the LED die 12 locates at a level higher than that of the bottom surface 112 of the encapsulation 11. Although the LED die 12 is totally embedded in the encapsulation 11, the back surface 122 of the LED die 12 is uncovered by the encapsulation 11 and exposed outside. A recess is defined under the LED die 12. In this variation, a circuit board 16a with a heat conductor 164a is provided. A top end of the heat conductor 164a extends upwardly beyond a top surface of the circuit board 16a, and is inserted in the recess to make the heat conductor 164a contact the LED die 12, whereby heat generated by the LED die 12 can be absorbed by the heat conductor 164a to enhance heat dissipation of the LED die 12.

Figure 5:
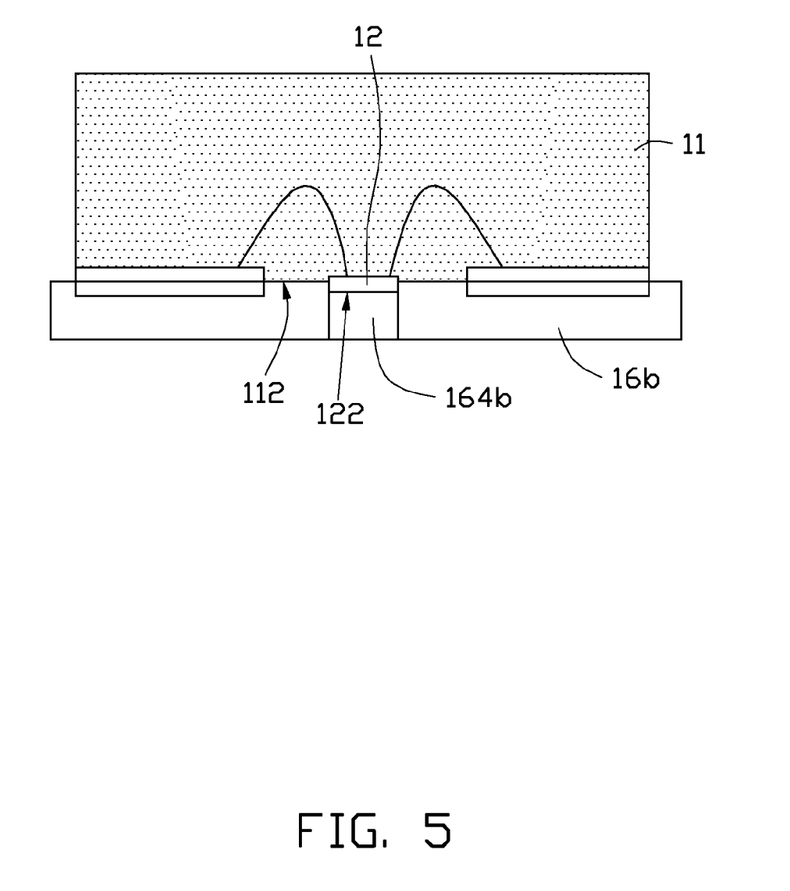
FIG. 5 is a schematic, cross-sectional view of a light emitting device in accordance with a second variation of the first embodiment.

Referring to FIG. 5, the back surface 122 of the LED die 12 locates at a level lower than that of the bottom surface 112 of the encapsulation 11. The LED die 12 is partly embedded in the encapsulation 11. The back surface 122 of the LED die 12 is uncovered by the encapsulation 11 and located below the bottom surface 112 of the encapsulation 11. In the variation, a circuit board 16b with a heat conductor 164b is provided. A top end of the heat conductor 164b is lower than a top side of the circuit board 16a, and a recess is defined over the heat conductor 164b. A bottom of the LED die 12 extruded out of the encapsulation 11 is inserted in the recess and contacts the heat conductor 164b, whereby heat generated by the LED die 12 can be absorbed by the heat conductor 164b to enhance heat dissipation of the LED die 12.

Figure 6:
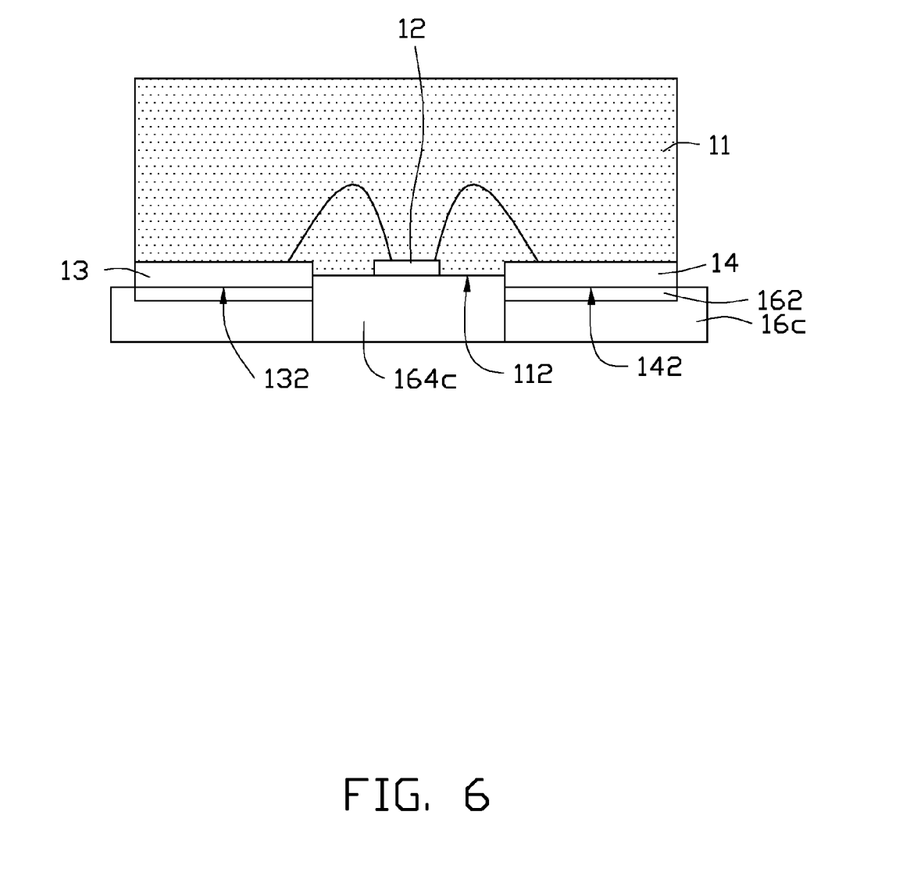
FIG. 6 is a schematic, cross-sectional view of a light emitting device in accordance with a third variation of the first embodiment.

Furthermore, the mounting surfaces 132, 142 of the electrodes 13, 14 and the bottom surface 112 of the encapsulation 11 can also be non-coplanar. Referring to FIG. 6, the mounting surfaces 132, 142 which are level with each other are located at a level lower than that of the bottom surface 112. A circuit board 16c is provided with a heat conductor 164c and circuit traces 162. The heat conductor 164c has a top face higher than top faces of the circuit traces 162. Thus, when the LED package is mounted to the circuit board 16c, the circuit traces 162 contact the electrodes 13, 14 to provide electric power to the LED die 12, while the heat conductor 164c contacts the LED die 12 to help heat dissipation of the LED die 12.

Figure 7:
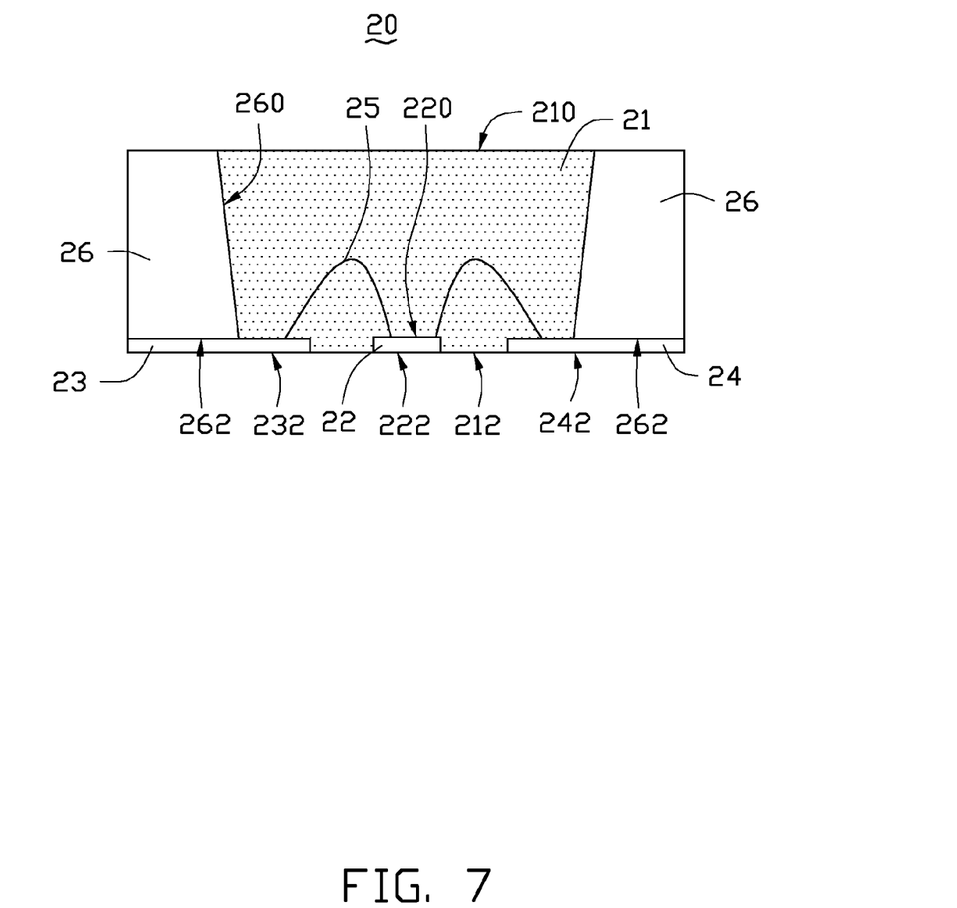
FIG. 7 is a schematic, cross-sectional view of an LED package in accordance with a second embodiment of the present disclosure.

Referring to FIG. 7, an LED package 20 according to a second embodiment includes an encapsulation 21, an LED die 22, a positive electrode 23, a negative electrode 24, and a reflective cup 26.

The encapsulation 21 is made of light transmissive materials, such as polycarbonate, PMMA and so on. The encapsulation 21 includes a light emitting surface 210, and a bottom surface 212 opposite to the light emitting surface 210.

The LED die 22 includes a front surface 220, and a back surface 222 opposite to the front surface 220. The front surface 220 is for outputting light outward. The back surface 222 is for dissipating heat outward. The LED die 22 is totally embedded in the encapsulation 21 with the front surface 220 facing the light emitting surface 210 while covered by the encapsulation 21, and the back surface 222 exposed to an external environment. In this embodiment, the back surface 222 and the bottom surface 212 are all planar surfaces, and the back surface 222 and the bottom surface 212 are coplanar.

The positive and negative electrodes 23 and 24 are respectively connected to an anode and a cathode (not illustrated) of the LED die 22 by metal wires 25. The positive and negative electrodes 23 and 24 are both planar plates. The positive electrode 23 includes a mounting surface 232 coplanar with the bottom surface 212 of the encapsulation 21. The negative electrode 24 includes a mounting surface 242 coplanar with the bottom surface 212 of the encapsulation 21.

The reflective cup 26 has an annular configuration defining a receiving hole 260. The receiving hole 260 receives the encapsulation 21 therein. The receiving hole 260 tapers from the light emitting surface 210 to the bottom surface 212.

The positive and negative electrodes 23, 24 are attached to a bottom 262 of the reflective cup 26. The mounting surfaces 232, 242 and the bottom surface 212 are coplanar as shown in FIG. 7; however they can be non-coplanar with each other.

Figure 8:
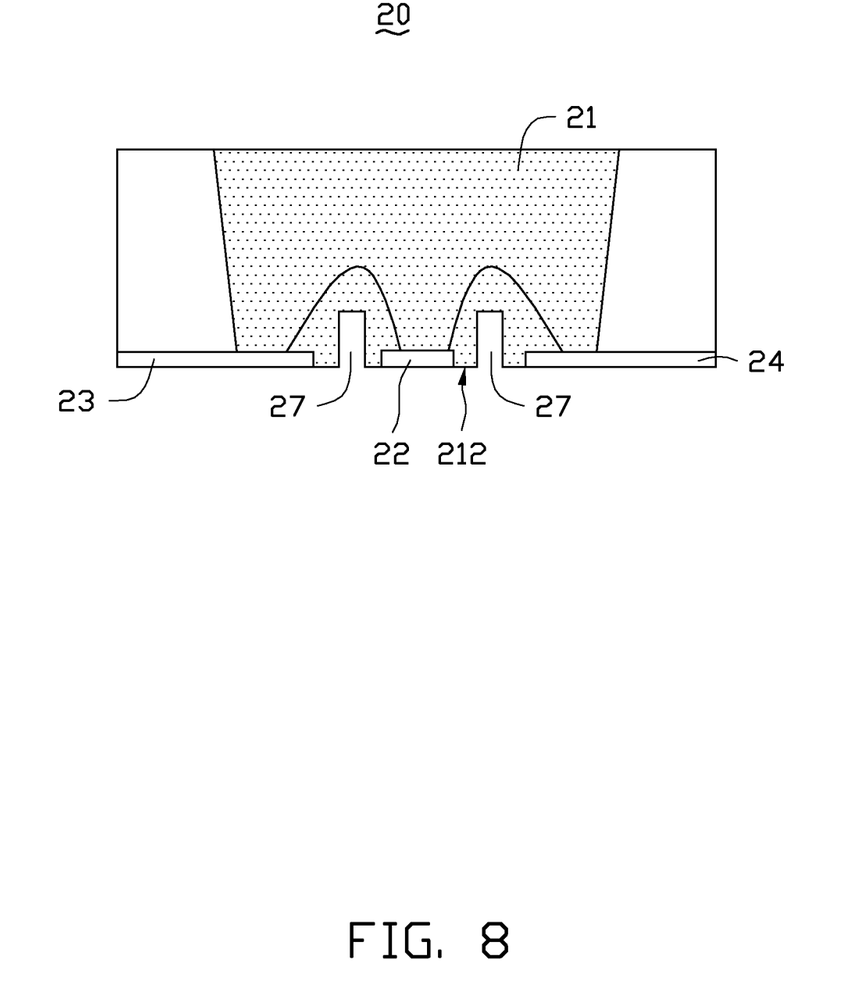
FIG. 8 is a schematic, cross-sectional view of an LED package in accordance with a first variation of the second embodiment.

According to a variation of the second embodiment, the encapsulation 21 can further include grooves 27 concaved inwards from the bottom surface 212 thereof, as illustrated in FIG. 8. The grooves 27 sit between the LED die 22 and the electrodes 23, 24. In this embodiment, the grooves 27 each have a rectangular profile in cross section.

Figure 9:
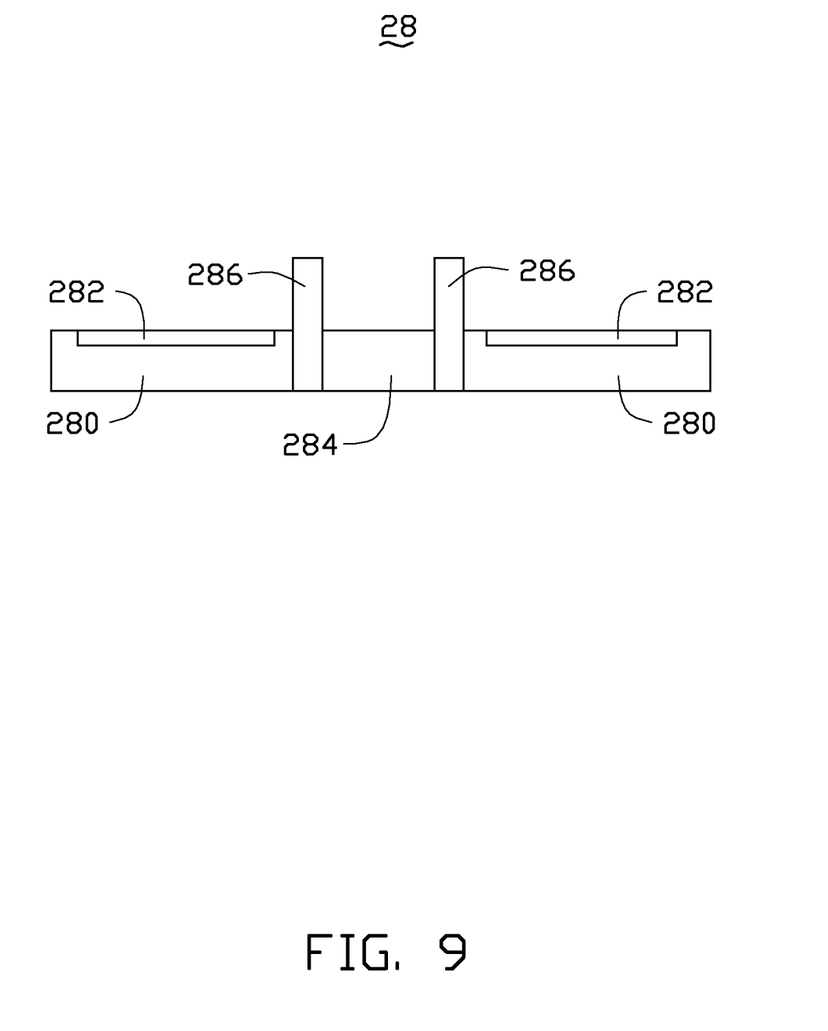
FIG. 9 is a schematic, cross-sectional view of a circuit board matching the LED package of FIG. 8.

Referring to FIG. 9, a circuit board 28 matching the LED package 20 is provided. The circuit board 28 includes a substrate 280, circuit traces 282 arranged on the substrate 280, a heat conductor 284 extending in the substrate 280 with top and bottom of the heat conductor 284 being exposed, and baffle plates 286 isolating the heat conductor 284 from the substrate 280 and the circuit traces 282. The substrate 280 is made of an electrically insulating material. The circuit traces 282 are for contacting with the positive and negative electrodes 23 and 24, thereby providing electrical power to the LED die 22. The heat conductor 284 is made of a material with a high thermal conductivity, for example metal. The baffle plates 286 have upper ends thereof extending outside of and above the substrate 280.

Figure 10:
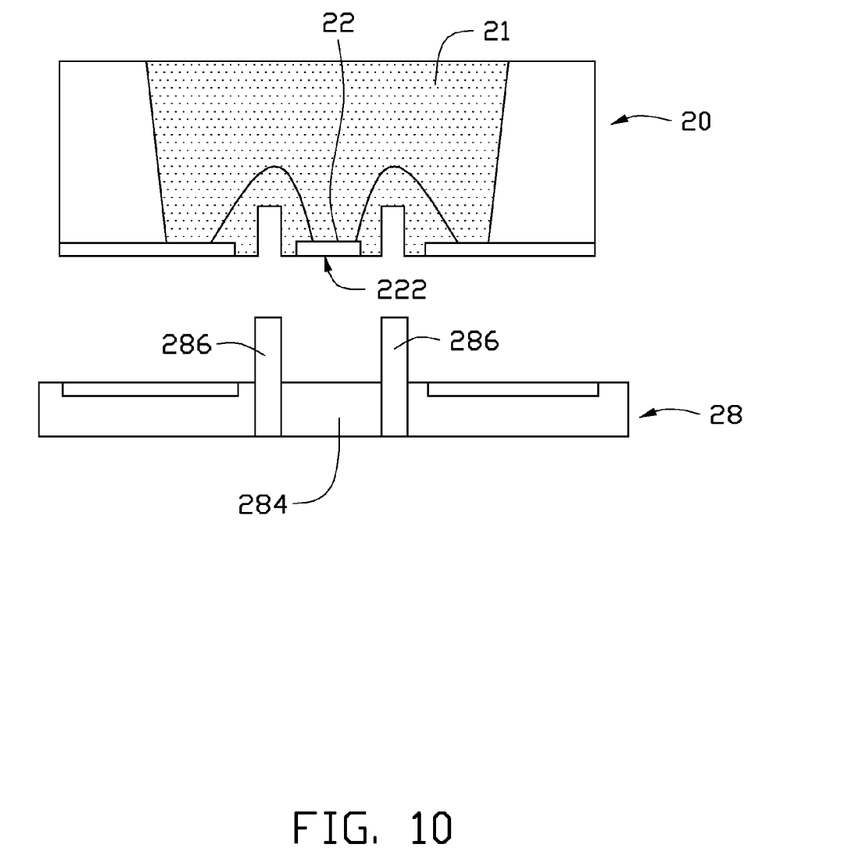
FIG. 10 is a schematic, cross-sectional view of the LED package of FIG. 8 to be mounted on the circuit board of FIG. 9 to form a light emitting device according to a second embodiment of the present disclosure.

Referring to FIG. 10, due to that the back surface 222 is exposed outside, the LED die 22 has its back surface 222 directly contact the heat conductor 284 when mounted to the circuit board 28. Accordingly, heat generated by the LED die 22 can be transferred, via the heat conductor 284, from the back surface 222 to a distal side of the circuit board 28 away from the LED die 22. Thereby, high efficiency of heat dissipation is achieved. The upper ends of the baffle plates 286 are extended into the grooves 27, thereby increasing bonding strength of the LED package 20 and the circuit board 28. The baffle plates 286 can also prevent solder from flowing from the positive and negative electrodes 23, 24 to the LED die 22, during the soldering process, thereby avoiding short circuit, damage or contamination of the LED die 22.

Figure 11:
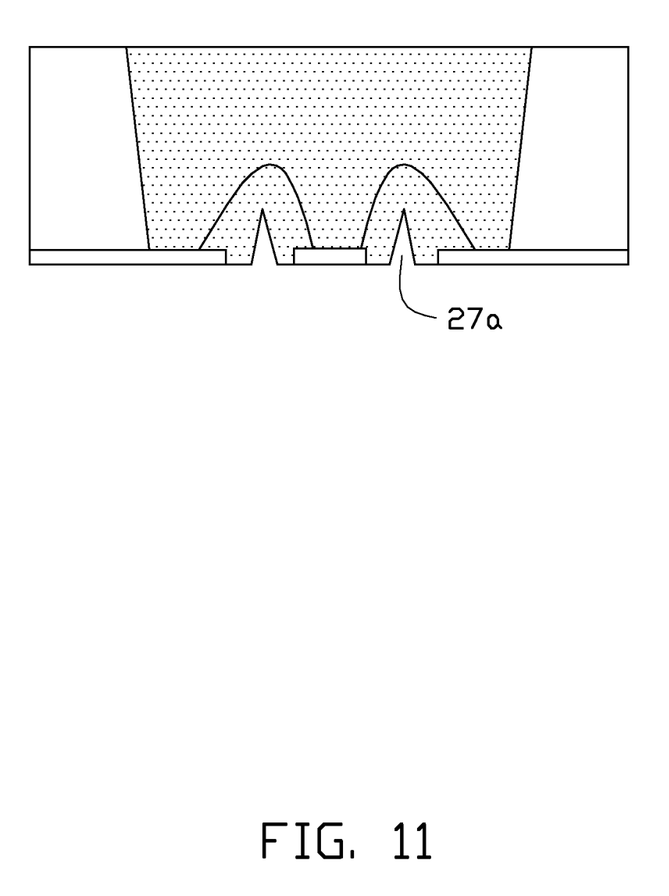
FIG. 11 is a schematic, cross-sectional view of an LED package in accordance with a second variation of the second embodiment.

The grooves 27 are not limited to have the rectangular profiles as illustrated in FIG. 10. The grooves 27 can also have other profiles. As illustrated in FIG. 11, the grooves 27a each have a v-shaped profile. The inclined sidewalls of the grooves 27a can be designed with a certain angle in inclination to satisfy a predetermined light reflecting desire.

Figure 12:
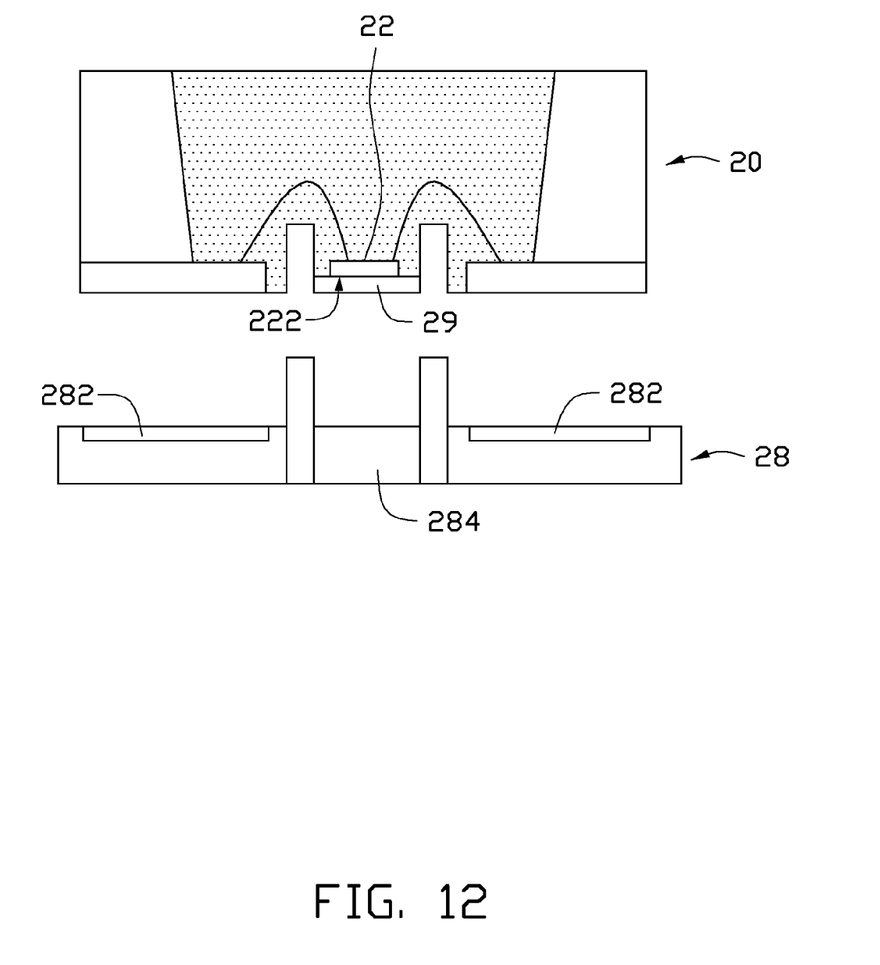
FIG. 12 is a view similar to FIG. 10, showing a variation thereof.

Furthermore, referring to FIG. 12, the back surface 222 can have a thermally conductive film 29 formed thereon. Accordingly, when the LED package 20 is mounted to the circuit board 28, the thermally conductive film 29 is sandwiched between the back surface 222 of the LED die 22 and the heat conductor 284. The thermally conductive film 29 covers the bottom surface 222 of the LED die 22 and a portion of the bottom surface 212 of the encapsulation 21 around the LED die 22 and between the grooves. The thermally conductive film 29 is employed to prevent solder from permeating into the encapsulation 21 during the soldering process.

Figure 13:
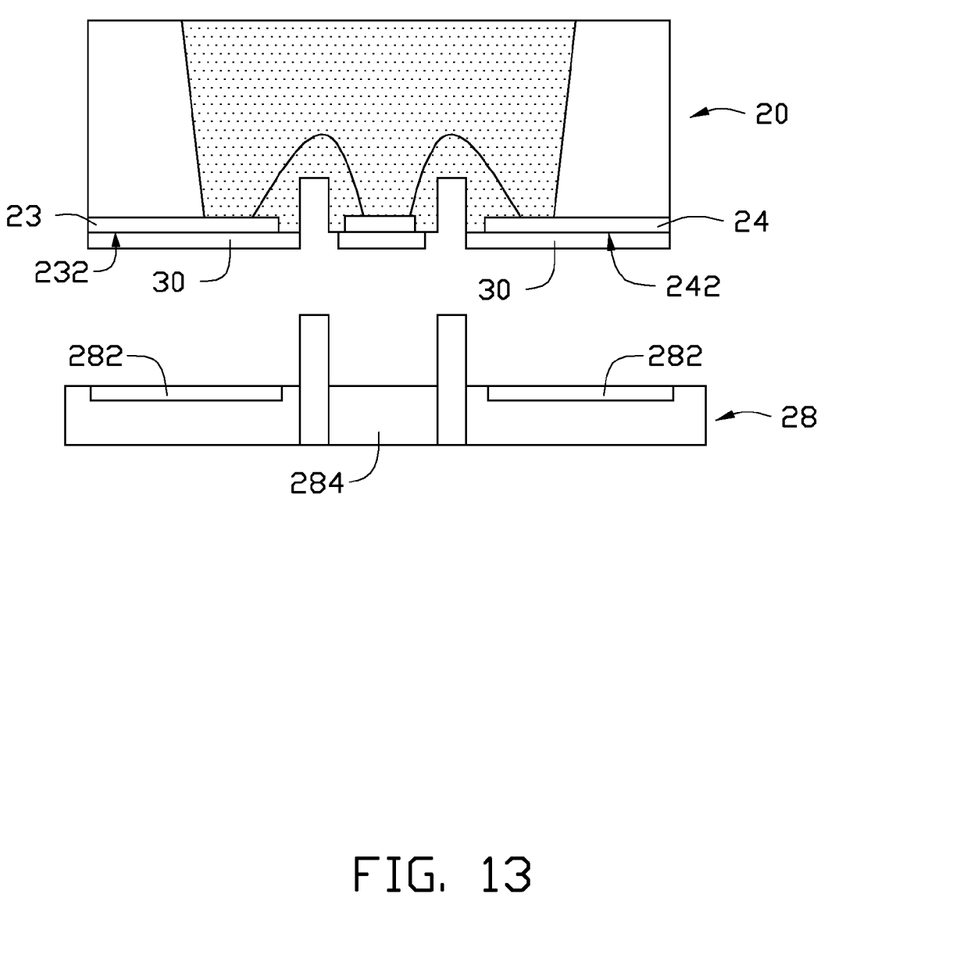
FIG. 13 is a view similar to FIG. 10, showing a further variation thereof.

Still furthermore, referring to FIG. 13, the mounting surfaces 232, 242 of the positive and negative electrodes 23, 24 each can have an electrically conductive film 30 formed thereon. Accordingly, when the LED package 20 is mounted to the circuit board 28, the electric conductive films 30 are sandwiched between the circuit traces 282 and the positive and negative electrodes 23, 24. The electric conductive films 30 cover the bottom surfaces of the positive electrode 23 and the negative electrode 24 and a portion of the bottom surface 212 of the encapsulation 21 neighboring the electrodes 23, 24 and between the positive and negative electrodes 23, 24 and the grooves. The electric conductive films 30 are employed to prevent solder from permeating into the encapsulation 21 during the soldering process.

It is to be understood that the above-described embodiments are intended to illustrate rather than limit the disclosure. Variations may be made to the embodiments without departing from the spirit of the disclosure as claimed. The above-described embodiments illustrate the scope of the disclosure but do not restrict the scope of the disclosure.

What is claimed is:

1. An LED package comprising:
    a light transmissive encapsulation, the encapsulation comprising a light emitting surface and a bottom surface opposite to the light emitting surface;
    an LED die received in the encapsulation, the LED die comprising a front surface for outputting light outward and a back surface opposite to the front surface, the front surface being covered by the encapsulation and facing the light emitting surface of the encapsulation, the back surface being exposed outside of the encapsulation;
    a positive electrode electrically connected to an anode of the LED die; and
    a negative electrode electrically connected to a cathode of the LED die;
    wherein the encapsulation further defines a groove in the bottom surface of the encapsulation and between the LED die and one of the positive and negative electrodes.

2. The LED package according claim 1, wherein the back surface of the LED die and the bottom surface of the encapsulation are both planar surfaces, the back surface of the LED die and the bottom surface of the encapsulation being coplanar.

3. The LED package according claim 1, wherein the back surface of the LED die and the bottom surface of the encapsulation are both planar surfaces, the back surface of the LED die and the bottom surface of the encapsulation being non-coplanar.

4. The LED package according claim 1, further comprising an annular reflective cup with a receiving hole, the encapsulation being received in the receiving hole, the receiving hole tapering from the light emitting surface to the bottom surface of the encapsulation.

5. The LED package according claim 4, wherein the reflective cup comprises a bottom near the bottom surface of the encapsulation, and the positive electrode and the negative electrode are attached to the bottom of the reflective cup.

6. The LED package according claim 1, wherein the positive electrode and the negative electrode are embedded in the encapsulation.

7. The LED package according claim 6, wherein the positive electrode and the negative electrode are both planar plates, the positive electrode and the negative electrode each comprising an attaching surface facing the light emitting surface of the encapsulation and a mounting surface opposite to the attaching surface, the attaching surfaces of the positive electrode and the negative electrode being embedded in the encapsulation, the mounting surfaces being exposed outside of the encapsulation.

8. The LED package according claim 7, wherein the mounting surfaces of the positive electrode and the negative electrode are coplanar with the bottom surface of the encapsulation.

9. The LED package according claim 7, wherein the mounting surfaces of the positive electrode and the negative electrode are non-coplanar with the bottom surface of the encapsulation.

10. A light emitting device, comprising:
    an LED package comprising:
    a light transmissive encapsulation, the encapsulation comprising a light emitting surface and a bottom surface opposite to the light emitting surface;
    an LED die received in the encapsulation, the LED die comprising a front surface for outputting light outward and a back surface opposite to the front surface, the front surface being covered by the encapsulation and facing the light emitting surface of the encapsulation;
    a positive electrode electrically connected to an anode of the LED die; and
    a negative electrode electrically connected to a cathode of the LED die; and
    a circuit board comprising an electrically insulating substrate, circuit traces formed on the substrate, and a heat conductor extending in the substrate, the positive electrode and the negative electrode respectively contacting the circuit traces, the back surface of the LED die contacting the heat conductor;
    wherein the encapsulation further defines at least one groove in the bottom surface of the encapsulation and between the LED die and one of the positive and negative electrodes.

11. The light emitting device according claim 10, further comprising an electrically conductive film sandwiched between the circuit traces and the positive and negative electrodes, the electrically conductive film covering bottoms of the positive and negative electrodes and a portion of the bottom surface of the encapsulation neighboring the positive and negative electrodes.

12. The light emitting device according claim 10, further comprising a thermally conductive film sandwiched between the back surface of the LED die and the heat conductor, the thermal conductive film covering a bottom of the LED die and a portion of the bottom surface of the encapsulation around the LED die.

13. The light emitting device of claim 10, wherein the circuit board has at least one baffle plate extending upwardly from the circuit board with a top end of the at least one baffle plate being located above a top of the circuit board, the at least one baffle plate being located adjacent to the heat conductor and inserted into the at least one groove.

14. The light emitting device of claim 13, wherein the at least one groove has a rectangular profile in cross section.

15. The light emitting device of claim 13, wherein the at least one groove has a triangular profile in cross section.

16. The light emitting device of claim 14, wherein light generated by the LED chip is reflected by a wall of the encapsulation defining the triangular groove.

17. An LED package comprising:
    a light transmissive encapsulation, the encapsulation comprising a light emitting surface and a bottom surface opposite to the light emitting surface;
    an LED die received in the encapsulation, the LED die comprising a front surface for outputting light outward and a back surface opposite to the front surface, the front surface being covered by the encapsulation and facing the light emitting surface of the encapsulation, the back surface being exposed outside of the encapsulation;
    a positive electrode electrically connected to an anode of the LED die; and a negative electrode electrically connected to a cathode of the LED die;

wherein the positive electrode and the negative electrode are embedded in the encapsulation, the positive electrode and the negative electrode are both planar plates, the positive electrode and the negative electrode each comprising an attaching surface facing the light emitting surface of the encapsulation and a mounting surface opposite to the attaching surface, the attaching surfaces of the positive electrode and the negative electrode being embedded in the encapsulation, the mounting surfaces being exposed outside of the encapsulation, and the mounting surfaces of the positive electrode and the negative electrode are non-coplanar with the bottom surface of the encapsulation.

18. The LED package according claim 17, further comprising an annular reflective cup with a receiving hole, the encapsulation being received in the receiving hole, the receiving hole tapering from the light emitting surface to the bottom surface of the encapsulation.

19. The LED package according claim 18, wherein the reflective cup comprises a bottom near the bottom surface of the encapsulation, and the positive electrode and the negative electrode are attached to the bottom of the reflective cup.

20. The LED package according claim 17, wherein the back surface of the LED die and the bottom surface of the encapsulation are both planar surfaces, the back surface of the LED die and the bottom surface of the encapsulation being coplanar.

\* \* \* \* \*